United States Patent
Schlenter

(10) Patent No.: US 10,267,613 B2
(45) Date of Patent: Apr. 23, 2019

(54) ELECTRONIC DETONATOR LEAKAGE CURRENT RESTRICTION

(71) Applicant: DETNET SOUTH AFRICA (PTY) LTD, Woodmead (ZA)

(72) Inventor: Craig Charles Schlenter, Woodmead (ZA)

(73) Assignee: Detnet South Africa (Pty) Limited, Johannesburg (ZA)

( * ) Notice: Subject to any disclaimer, the term of this patent is extended or adjusted under 35 U.S.C. 154(b) by 0 days.

(21) Appl. No.: 15/508,717

(22) PCT Filed: Sep. 1, 2015

(86) PCT No.: PCT/ZA2015/000057
§ 371 (c)(1),
(2) Date: Mar. 3, 2017

(87) PCT Pub. No.: WO2016/037196
PCT Pub. Date: Mar. 10, 2016

(65) Prior Publication Data
US 2017/0276466 A1    Sep. 28, 2017

(30) Foreign Application Priority Data

Sep. 3, 2014 (ZA) .................. 2014/06453

(51) Int. Cl.
*F42D 1/055* (2006.01)
*F42D 1/04* (2006.01)
*H03K 17/08* (2006.01)

(52) U.S. Cl.
CPC ............. *F42D 1/055* (2013.01); *F42D 1/043* (2013.01); *H03K 17/08* (2013.01)

(58) Field of Classification Search
CPC .......... F42D 1/043; F42D 1/055; H03K 17/08
See application file for complete search history.

(56) References Cited

U.S. PATENT DOCUMENTS

| | | | | |
|---|---|---|---|---|
| 4,419,933 A | * | 12/1983 | Kirby | F42B 3/122 102/206 |
| 4,846,066 A | * | 7/1989 | Beattie | F42D 1/055 102/215 |
| 6,966,262 B2 | * | 11/2005 | Jennings, III | F42D 1/05 102/206 |
| 7,451,700 B1 | * | 11/2008 | Land | F42D 1/04 102/209 |
| 7,617,775 B2 | * | 11/2009 | Teowee | F42B 3/122 102/206 |

(Continued)

OTHER PUBLICATIONS

Written Opinion of the International Searching Authority for Application No. PCT/ZA2015/000057 dated Feb. 10, 2016 (5 pages).

(Continued)

*Primary Examiner* — Joshua E Freeman
*Assistant Examiner* — Bridget A Cochran
(74) *Attorney, Agent, or Firm* — Michael Best & Friedrich LLP

(57) ABSTRACT

A detonator system wherein a detonator is connected via a down-hole harness to a bus extending from a blast controller and wherein a component is connected in series with the down-hole harness to limit leakage current in the harness to a level which can be accommodated by the blast controller.

20 Claims, 4 Drawing Sheets

(56) References Cited

U.S. PATENT DOCUMENTS

| | | | |
|---|---|---|---|
| 7,694,627 B2* | 4/2010 | Koekemoer | F42D 1/055 102/206 |
| 7,911,760 B2 | 3/2011 | Lownds | |
| 8,646,387 B2* | 2/2014 | Schlenter | F42D 1/055 102/200 |
| 2007/0125256 A1* | 6/2007 | Frickey | F42D 1/043 102/205 |
| 2008/0134923 A1* | 6/2008 | Lownds | F42D 1/055 102/215 |
| 2010/0288149 A1* | 11/2010 | Schlenter | F42D 1/055 102/217 |
| 2011/0155012 A1* | 6/2011 | Perez Cordova | F42B 3/122 102/215 |
| 2013/0036931 A1* | 2/2013 | Schlenter | F42D 1/045 102/206 |
| 2017/0303246 A1* | 10/2017 | Wang | H04L 5/0007 |

OTHER PUBLICATIONS

Search Report of the International Searching Authority for Application No. PCT/ZA2015/000057 dated Feb. 10, 2016 (3 pages).

* cited by examiner

ELECTRONIC DETONATOR LEAKAGE CURRENT RESTRICTION

CROSS-REFERENCE TO RELATED APPLICATIONS

This application is a U.S. National Phase of International Patent Application No. PCT/ZA2015/000057, filed Sep. 1, 2015, which claims priority to ZA 2014/06453, filed Sep. 3, 2014, the entire contents of both of which are incorporated by referenced herein.

BACKGROUND OF THE INVENTION

This invention relates generally to an electronic blasting system and is particularly concerned with limiting the effects of undesirable leakage currents which may occur in the system.

As used herein "leakage current" includes current flow in a blasting system that does not directly contribute to the effective operation of electronic detonators in the system.

An electronic blasting system typically rakes use of a plurality of electronic detonators. Each detonator may include one or more capacitors which are used to ensure autonomous operation of the detonator if connecting wires to the detonator are broken, for example due to the effect of a blast at an adjacent borehole which may manifest itself before the detonator is to initiate.

The energy density requirement imposed by current consumption of an electronic detonator, the energy required to initiate a fuse head and space constraints side a detonator tube normally suggest the use of tantalum capacitors over other capacitor technologies. A tantalum capacitor has a low internal leakage current and is suitable for use in a blasting system which may call for hundreds, or even thousands, of electronic detonators to be used in a single blast.

Although a tantalum capacitor performs well in this type of application it can suffer from a failure mode that could result in the capacitor short-circuiting. This type of event can be catastrophic in a blasting system in which electronic detonators are connected in parallel to one another and are powered through a shared wire bus connected to a control device which may be some distance from a blast bench.

A short circuit in a capacitor, which is inside a detonator, results in a high current consumption and severe voltage starvation on a wire bus to which the detonator is connected. This can reduce the voltage available for blasting which, in turn, can cause a misfire in the affected detonator and which can also cause other detonators in the blasting system to misfire. Alternatively a significant time delay may be incurred while the faulty detonator is being identified and remedial action is taken.

The aforementioned problem is exacerbated if this type of failure only occurs once a supply voltage is raised to a level which is sufficiently high to supply blasting energy. The voltage increase is typically done only once mining equipment and personnel hare been evacuated from a blasting area and production would thus be brought to a standstill during this time. A delay of this type can result in significant financial losses.

There are other failures which can be detrimental to a parallel blasting circuit. For example damage to the insulation of wires, that typically occurs when a detonator is loaded into a blast hole, can cause current leakage or a short-circuit. A similar adverse effect can be produced by the ingress of a fluid into a detonator due to poor sealing between a crimp plug and a detonator tube, and similar factors.

A further concern is that a current leakage problem may not be apparent immediately when a detonator is loaded into a blast hole but may only appear after some time, possibly as wire to the detonator stretches during hole slumping, or due to a slow ingress of fluid into the detonator over time.

A typical blasting system can tolerate leakage currents of the order of tens of milliamps before voltage starvation occurs at which stage detonators may misfire due to insufficient voltage levels.

One approach adopted to identify where a leakage current or short circuit problem occurs in a blast system is to query the detonators in the system, electronically, to establish whether sufficient voltage is available. This approach allows a problem blast hole to be identified. For example, a detonator in the blast hole can measure an applied voltage and then respond to an interrogating module indicating whether the voltage is adequate or too low. Alternatively, an indication of the position of a problem can be obtained if one or more detonators do not respond at all for example if insufficient voltage is available or if a fault is present.

The location of a single short circuit in a blast system can sometimes be identified by measuring the resistance between the bus wires. This approach works if the resistance per unit length of the bus wire is known and if there are no significant contributors current flow through the bus wire.

In some systems detonators are connected sequentially to a two-wire bus by means of electronic circuits each of which, typically, is housed in a connector located on surface adjacent a borehole. This sequential connection methodology can allow for accurate determination of the location of a leakage or short circuit problem as is contemplate in U.S. Pat. No. 8,646,387.

An alternative solution is presented in US patent application No. 2013/0036931. This application describes opening a switch in reply to a signal from a detonator in response to an event, thus potentially disconnecting a remaining chain of detonators from the wire bus. However, the disconnection of an entire chain of detonators is not helpful if the cause of the leakage problem lies in a single borehole.

U.S. Pat. No. 7,911,760 is similarly limited in that a remain chain of detonators is controlled via an actuator on a wire bus.

U.S. patent application Ser. No. 13/582,688 discloses the use of a resistor in a detonator connector. A current through the resistor is sensed by monitoring the voltage, over the resistor, which is used to switch the gate of a FET. The resistor is thus used as a sensing element and not for current limiting purposes.

Although it is possible to modify systems of the aforementioned kind to isolate problem holes, the electronics required are relatively complex and can be expensive.

The effect of leakage current in a blasting system can be limited by decreasing the resistance of the bus wire so that the voltage drop across the bus wire due to a leakage current is limited. This approach requires a thicker bus wire, or additional bus wire. Alternatively each end of the detonator bus wire connected to a control unit so that the bus wire can be driven from both ends. These methods can however produce additional delays, particularly if problems are experienced only when a blasting voltage is applied to the bus wire.

It is also possible to raise the blast voltage to overcome losses due to a problem near an end of the bus wire. This, however, can expose some detonators to a voltage which exceeds a rated operating voltage.

An object of the invention is to provide an inexpensive and easy to implement mechanism for limiting, at least to some extent, the impact of problems due to leakage currents.

SUMMARY OF THE INVENTION

The invention provides a blasting system which includes a blasting control machine, a detonator bus connected to the blasting control machine, a plurality of electronic detonators, a plurality of down-hole harnesses each detonator being connected to a respective down-hole harness, a plurality of connectors, each connector connecting a respective down-hole harness to the bus whereby the detonators are connected in parallel to the bus, and, in respect of each detonator, at least one current-limiting component which is connected in series with the respective down-hole harness and which limits current in the down-hole harness to a current level that can be accommodated by the blasting control machine in the presence of at least one fault, which causes current leakage, that is present either in the down-hole harness or internally in the detonator.

The predetermined current level may be the level of the current which would flow if the current-limiting component were absent.

The current the blasting machine is normally determined by considering the current consumption of a full load of detonators plus some margin to allow for leakage. For example, if a detonator consumes 20 µA when powered at a high voltage for blasting, and 300 detonators need to be accommodated on the harness, then a current of 6 mA is required, plus some margin to allow for leakage etc. In practice as the harness wire and detonators present a highly capacitive load to the blasting machine, additional current is required to "drive the harness" appropriately and to produce acceptable communication signals. In a typical blasting system the blasting current limit is in the range of 20 mA to about 100 mA, depending on the system and various other design considerations.

The fault may be at least one short circuit either on the down-hole harness or internally in the detonator.

The current-limiting component may be located within a housing of the respective connector or in an in-line module which is connected to the down-hole harness.

Preferably in use, the current-limiting component is located outside a blast hole in which the respective detonator is positioned. This helps to reduce the likelihood that the current-limiting component would be damaged while the blast hole is being loaded.

It is possible to connect a respective current-limiting component in series in each wire of the down-hole harness to restrict the nature of a problem which would occur if one wire were to be inadvertently coupled to earth. Such coupling could result in an undesirable current flow if another part of the blasting system were to be earthed in some way.

In one form of the invention the current-limiting component comprises a resistor. It is possible to make use of a current-limiting diode or a JFET equivalent but, in general, these devices are more expensive than a resistor.

In an alternative approach the current-limiting component includes a current-limiting circuit that, in response to the current in the respective down-hole harness, disconnects the down-hole harness from the bus if the current exceeds a predetermined level.

It is within the scope of the invention to take current measurements over a period of time before a decision to disconnect is made. This makes the circuit insensitive to typical high start-up currents which may occur when a capacitor inside a detonator is discharged and the down-hole harness to the detonator is powered.

The current-limiting circuit may be non-latching so that, when the current is reduced to an acceptable level, the connection to the down-hole harness is restored.

Preferably, though the current-limiting circuit is latching so that the down-hole harness remains disconnected from the bus until power is removed for a reasonable period. This approach minimises the effect of a problem blast hole on the remainder of the blast system although it is then not possible to fire the affected detonator.

It is generally not viable to make use of a conventional fuse or resettable fuse to limit the current in a manner similar to what has been described, for the current concerned are typically too for commercially available fuses. Additionally, a non-resettable characteristic can be unsuitable if a user wishes to resolve a problem under certain conditions, for example if a particular detonator is critical to a blasting plan. In these circumstances, in order to minimize the effect of a leakage circuit, it may be desirable to connect the detonator to a first bus that is driven independently of a second bus and its associated detonators.

BRIEF DESCRIPTION OF THE DRAWINGS

The invention is further described by way of examples with reference to the accompanying drawings in which.

DESCRIPTION OF PREFERRED EMBODIMENTS

Figure 1:
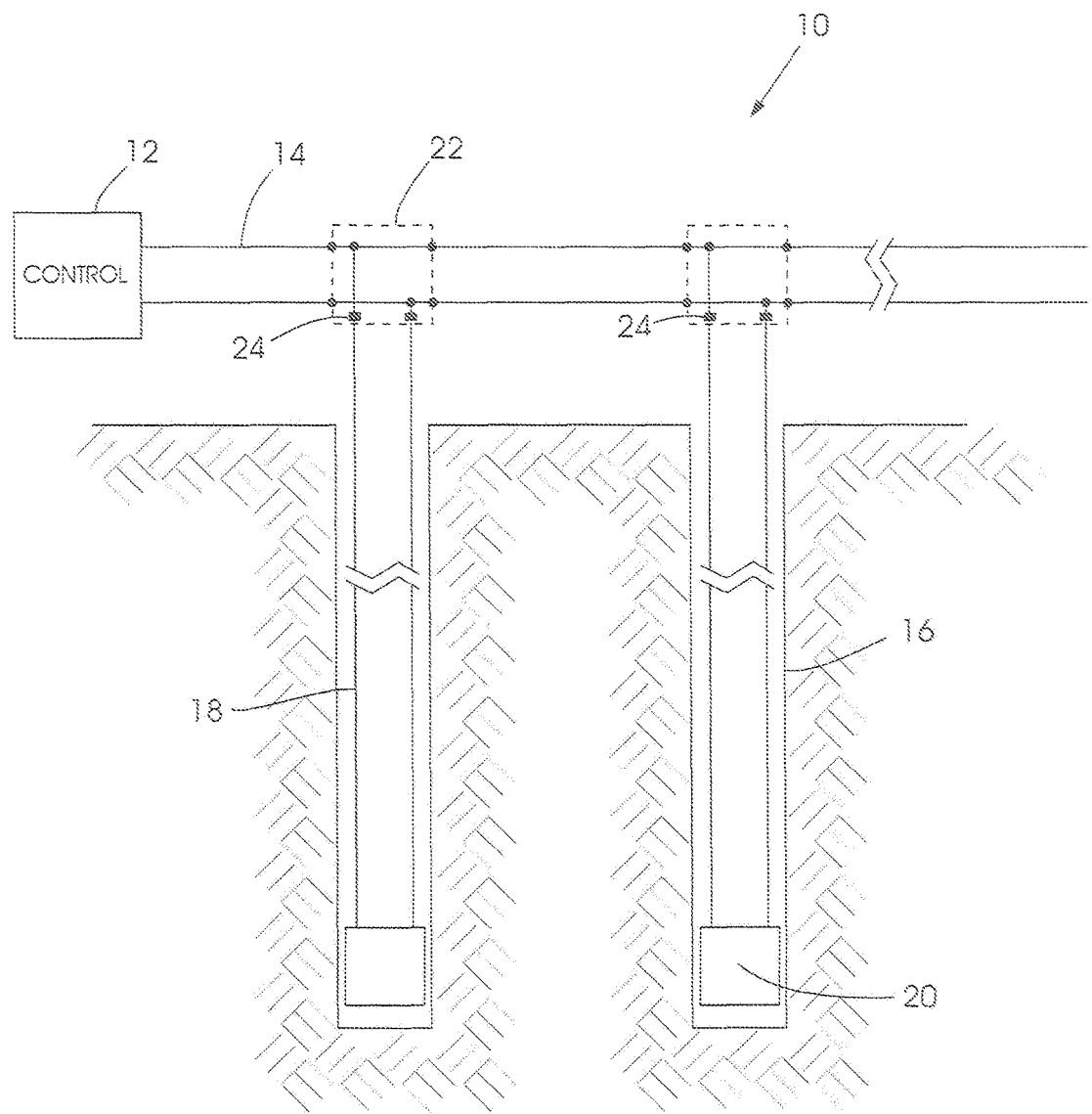
FIG. 1 schematically illustrates a blasting system according to one form of the invention.

FIG. 1 of the accompanying drawings illustrates a blasting system 10 which includes a blasting control machine 12, an elongate wire bus 14 which typically is located on surface and which is connected to the machine 12, a plurality of boreholes or blast holes 16, a plurality of detonator down-hole harnesses 18, a plurality of electronic detonators 20 and a plurality of connectors 22. The connectors 22 are shown in FIG. 1 in dotted outline, for ease of reference and, similarly, in FIGS. 2 and 3.

Each connector 22 is used to make a respective connection between the bus 14 and an associated down-hole harness 18 which, in turn, is connected to a respective detonator 20. In this way the detonators are connected in parallel to each other via the bus 14.

Each detonator 20 includes electronic elements and, typically, a custom designed control circuit (ASIC) (not shown), all mounted inside a detonator can, as is known n the art.

Explosive material, not shown, placed in each borehole is exposed to the respective detonator.

In a conventional approach resistors inside the detonator can to the value of about 1 kohm are connected in series with the ASIC. These resistors serve to protect the ASIC against a high applied voltage and also determine the level of talkback current modulation. For example, when powered from an 8 v supply rail the detonator will generate current modulation pulses of 4 mA. However, if the voltage is raised to a blasting voltage level of approximately 25 v, a capacitor short circuit would result in approximately 12.5 mA of current consumption which could be detrimental to blasting depending on the length of the bus line 14 and of the respective down-hole harness 18, the values of the respective associated resistances, and the effect thereof in relation to the maximum allowed leakage current.

Numerical values in this specification are exemplary only, and are non-limiting.

A more damaging situation occurs when a short circuit on a down-hole harness 18 results in the resistors being bypassed. The current consumption is then limited to the lesser of the current output limit of the blasting control machine 12, which is used to control the blasting process, and the current consumption which is attributable to the blasting voltage applied to the bus 14 up to the location of the short circuit. For example if the resistance presented to the blasting control machine 12 is 100 ohm and the blasting voltage is 25 v, the current load is approximately 250 mA. This means that detonators which are wired after the short circuit, i.e. which are downstream of the fault, would receive no appreciable voltage and would not fire.

Assume that two resistors 24 each of 2.4 kohm are connected in series with the aforementioned 1 kohm resistors and are located in the housing of the connector 22 which connects the down-hole harness 18 to the surface bus 14—see FIG. 1.

In normal communications, with an 8 v supply rail, the talkback current is reduced (for the given figures) to 8/(1000+1000+2400+2400)=1.17 mA. This low current reduces the signal to noise ratio of received detonator communication signals but it is still within the capabilities of a receiver in the blasting control machine 12 to detect and demodulate. The voltage loss which is induced during normal operation is also acceptable as a typical operating current of the order of 10 µA per detonator results in a negligible voltage drop across the series-connected 2.4 kohm resistors.

At a blasting voltage of 25 v, a short circuit in the down-hole harness 18, again assuming a resistance of 100 ohm, produces a current of 25/(100+2400+2400)=5.10 mA, a current value which is within the current leakage capabilities of the system.

Figure 2:
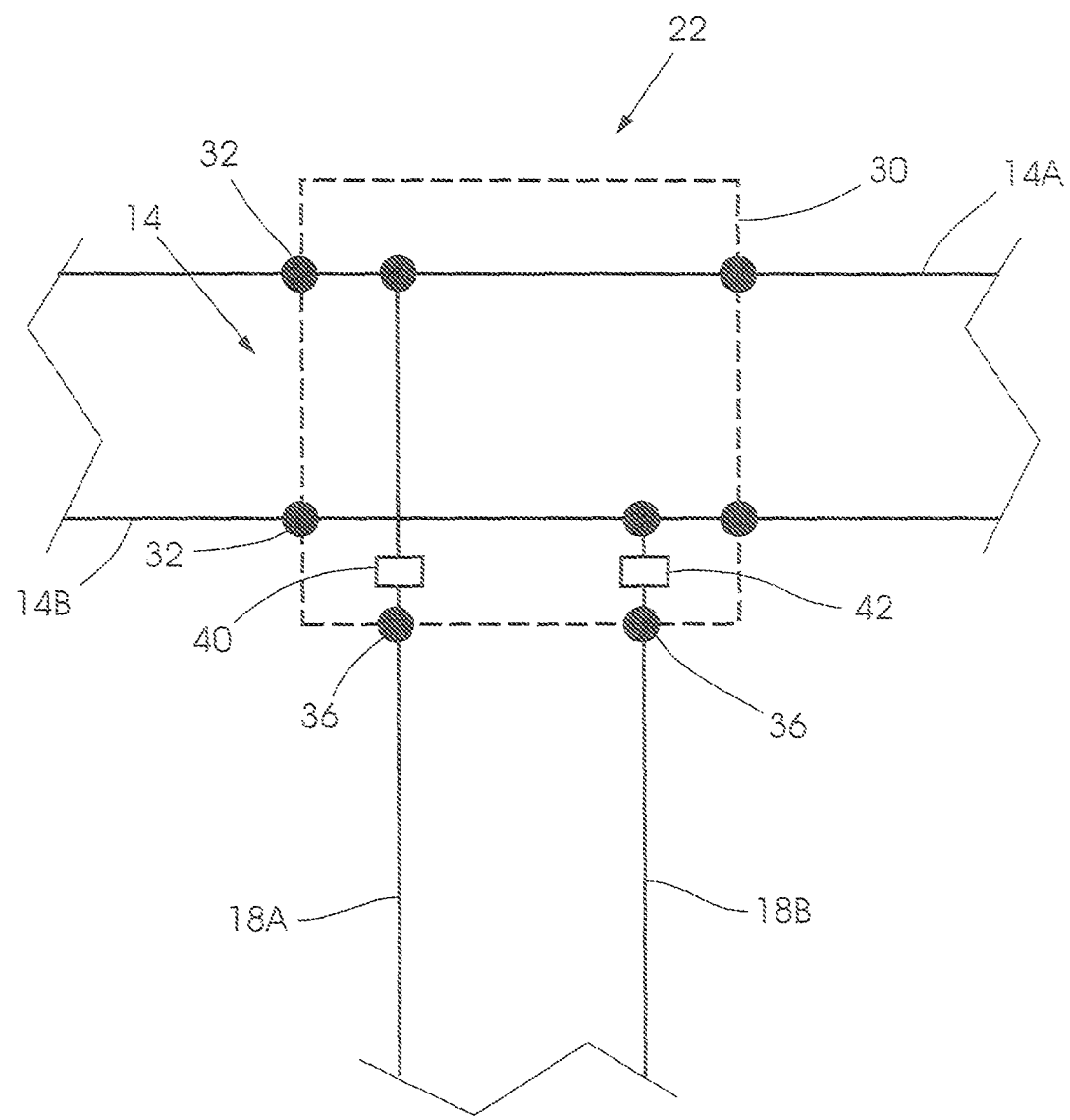
FIG. 2 is a view on an enlarged scale of a connector which is suitable for use in the system shown in FIG. 1.

FIG. 2 illustrates a housing 30 of a connector 22 which includes contacts 32 and contacts 36 for connecting wires 14A and 14B of the surface bus 14, to wires 18A and 18B of the respective downhole harness 18. The housing 30 contains two resistors 40 and 42 respectively, preferably of equal value, which are connected in series with the wires 18A and 186 respectively. The resistance of each resistor (for the given set of values) is of the order of 2.4 kohms. The resistors 40 and 42 of FIG. 2 are the same as the resistors 24 referred to in connection with FIG. 1.

The contacts 32 and 36 are shown in a notional sense only. Typically use is made of a custom-designed insulation displacement connector (IDC). Each line of the bus wire is directly connected to a respective connector and, at the same time, provision is made for a wire of the downhole harness to be connected to the same connector via a series resistor.

The resistors 40 and 42 limit the magnitude of leakage current to earth which could occur in each wire 18A and 18B. In other respects the operation of the blasting system would be in accordance with conventional techniques. Preferably, the current-limiting resistors 40, 42 are on surface i.e. inside the connector housing 30 so that the resistors are not exposed to damage which could arise during loading of the respective borehole 16.

Values of the resistors are given for explanatory purposes only. In practice the chosen resistor values are specific to a particular blasting system. The resistive values can be adjusted to take account of various factors and to suit a blasting system which has different operating characteristics bearing in mind however that the object is to limit the current in the downhole harness from exceeding a predetermined current value.

In the blasting systems described with reference to FIGS. 1 and 2 the resistors 24, 40 and 42 are used, directly, to limit the magnitude of the current flowing to the respective detonator. This effective and low cost technique, to counter the effect of a leakage current, is distinguishable from the approach referred to in connection with U.S. Ser. No. 13/582,688 which describes the use of a resistor, in a connector, as a current sensing element and not to restrict the magnitude of the current.

FIGS. 1 and 2 illustrate two resistors in use in each connector housing with one resistor being associated with each respective downhole wire. This is not necessarily the case. A single resistor could be used, preferably positioned on or in the connector housing. A single resistor only protects a single wire against a short to earth. In practice the most likely unwanted occurrence is that wires in the blast hole are connected to each other (i.e. the wires are shorted). A single resistor in one wire would then address this event.

Figure 3:
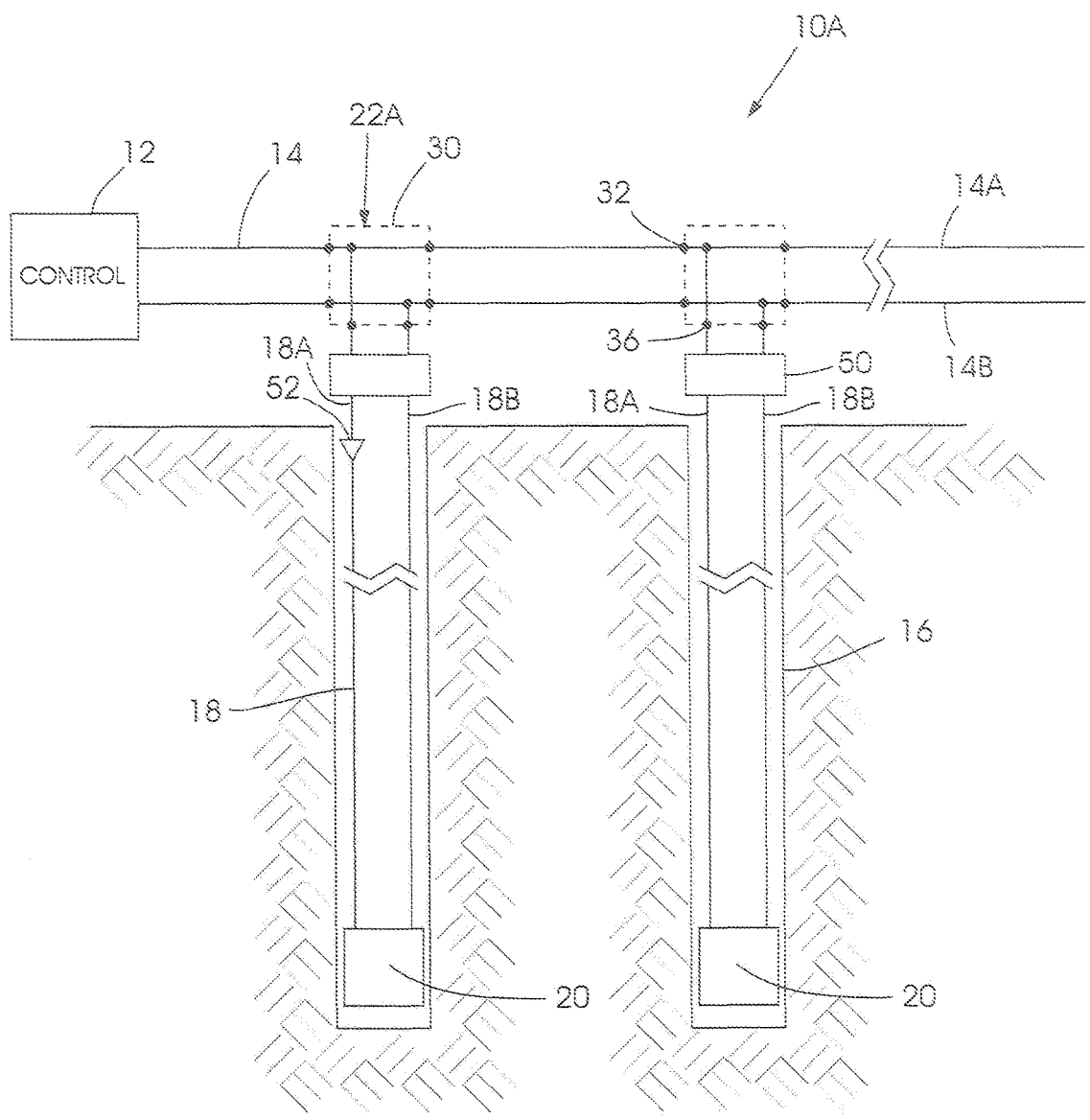
FIG. 3 shows another form of the invention.

FIG. 3 illustrates a blasting system 10A in which components which are the same as those referred to in connection with FIGS. 1 and 2 have like reference numerals.

Connectors 22A in the blasting system 10A are different from the connectors 22 shown in FIG. 2 in that they do not include internal current-limiting resistors. Instead a respective current-limiting circuit 50 is connected in series to each down-hole harness in principle the circuit 50 provides a function which is similar to that offered by the current-limiting resistors. The circuit 50 measures the current 52 in the down-hole harness 18 over a period of time. If the current 52 rises above a predetermined value the circuit 50, which contains a semi-conductor-based switch such as an FET, open circuits and isolates the associated detonator 20 from the surface bus 14. The circuit 50 then latches and the detonator 20 remains disconnected from the bus and no power is applied to the detonator, for a reasonable period.

Figure 4:
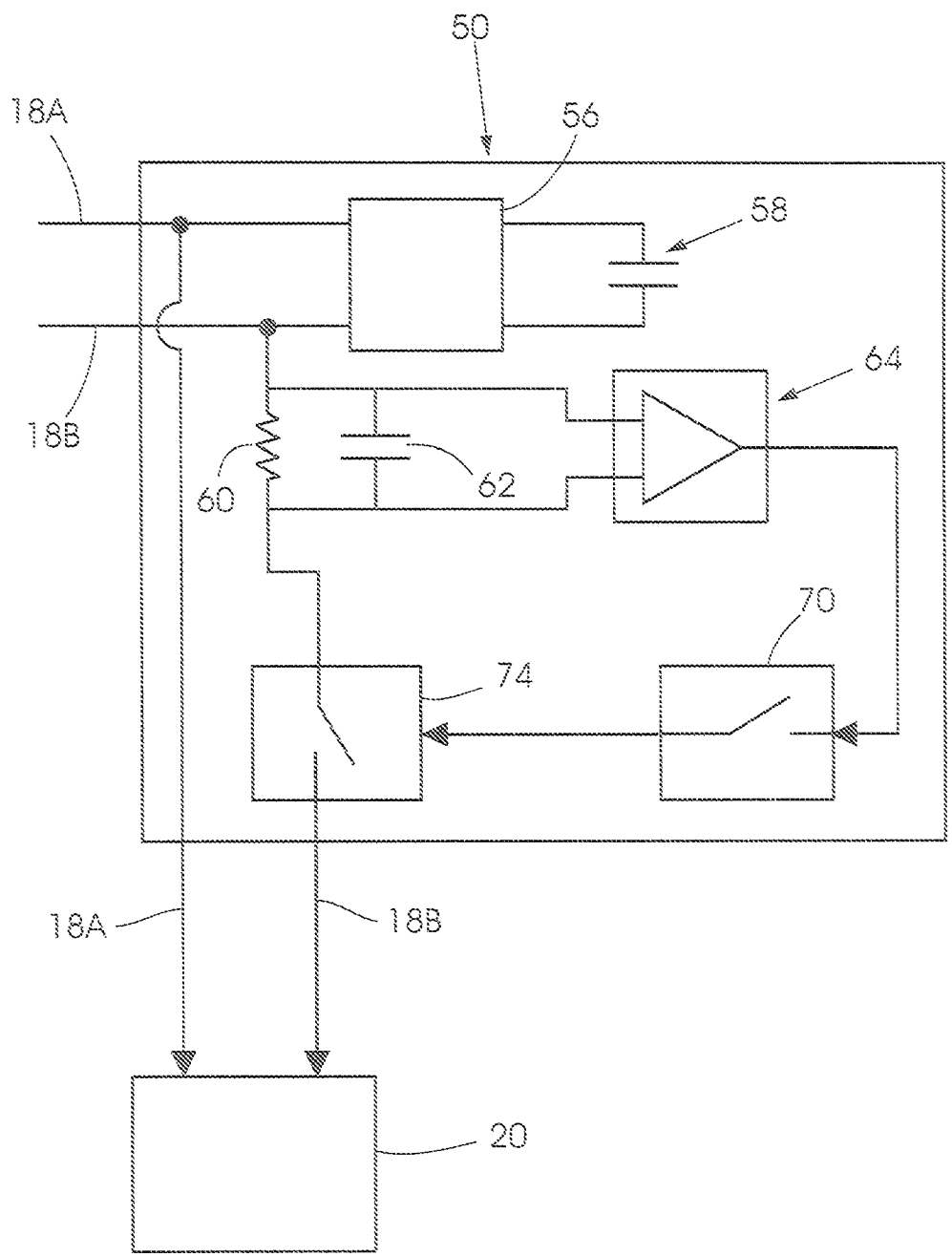
FIG. 4 shows details of a circuit for use in the arrangement of FIG. 3.

FIG. 4 illustrates aspects of a possible implementation of the circuit 50. The wires 18A and 18B are connected to a diode bridge 56 which, together with a capacitor 58 provides power for the circuit via various connections (not shown).

A resistor 60 and a capacitor 62, in parallel, produce a voltage which is dependent on the magnitude of the down-hole harness current and which is applied to a differential comparator 64.

The combination of the resistor 60 and the capacitor 62 also allows short bursts of high current to be ignored, a feature which is useful to avoid triggering upon reception of current modulated communication signals from the detonator or upon initial start-up when the detonator capacitor is discharged and a higher current is drawn until the detonator capacitor is fully charged.

The differential comparator 64 compares the voltage from the combination of the resistor 60 and capacitor 62, irrespective of the polarity thereof, to a chosen reference voltage 66 which is applied to a reference pin on the comparator and which is representative of the desired trigger current for the circuit. The reference voltage is produced by appropriate circuitry, not shown.

When the reference voltage is exceeded the comparator 64 switches and an output signal is applied to a latching circuit 70 which in turn controls the connection and disconnection of the associated detonator 20 to the surface harness via a voltage controlled switch 74.

Initially, upon power-up, the latching circuit 70 is set so that the switch 74 is closed and the detonator 20 is connected to the surface harness. When the specified current limit is exceeded and detected by the comparator 64, for a period of time the duration of which is determined by the resistor 60 and capacitor 62, the latching circuit 70 is reset by the output of the comparator 64 and the detonator 20 is disconnected from the surface harness by the switch 74 which is opened.

In order to reset the circuit 50 power is removed so that the capacitors 58 and 62 can discharge. Upon power-up as described, the switch 74 is closed and the detonator 20 is then reconnected to the surface bus.

The circuit of FIG. 4 only senses the current in one wire to the detonator. This technique can however be extended so that the current in the second wire is also sensed.

The current-limiting circuit 50 does consume current and it requires several components for its effective implementation. The use of resistors to limit current, as has been described with reference to FIGS. 1 and 2, is thus of lower cost and easier to implement although such use does not offer the latching characteristic which is available with the circuit 50.

In FIG. 3 the circuit 50 is shown displaced from the connector 22A but this is exemplary only for the circuit is preferably located inside the connector housing 30 or is otherwise directly physically associated with the connector 22A.

The invention allows detonators, which are subject to leakage current-induced voltage losses, to be identified, for example, by means of querying the detonators as is known in the art. The effect is such that the detonator concerned would probably not fire successfully. However blasting can proceed as the voltage which is supplied to other detonators would not be adversely affected.

A benefit of the invention lies in the fact that it is low in cost and simple to implement. The invention allows a blast to continue even if leakage problems are detected at a high voltage which would ordinarily have prevented blasting completely or would have resulted in misfires in detonators apart from those detonators which are directly affected by the current leakage problems.

The invention claimed is:

1. A blasting system which includes a blasting control machine, a detonator bus connected to the blasting control machine, a plurality of electronic detonators, a plurality of down-hole harnesses, each detonator of the plurality of detonators being connected to a respective down-hole harness of the plurality of down-hole harnesses, a plurality of connectors, each connector connecting the respective down-hole harness to the bus whereby the plurality of detonators are connected in parallel to the bus, wherein at least one current-limiting component is connected in series with the respective down-hole harness and said detonator; and wherein said current-limiting component limits current in the down-hole harness to a current level that can be accommodated by the blasting control machine in the presence of at least one fault that is present either in the down-hole harness or internally in the detonator, the at least one fault causing current leakage, wherein the at least one currently limiting component is a resistor.

2. A blasting system according to claim 1 wherein said current level is the level of the current which would flow if the current-limiting component were absent.

3. A blasting system according to claim 1 wherein said fault is a short circuit.

4. A blasting system according to claim 1 wherein the current-limiting component is located within a housing of the respective connector or in an in-line module which is connected to the down-hole harness.

5. A blasting system according to claim 1 wherein, in use, the current-limiting component is located outside a blast hole in which the respective detonator is positioned.

6. A blasting system according to claim 1 wherein the at least one current-limiting component is connected in series in a wire of the down-hole harness.

7. A blasting system according to claim 1 wherein the current-limiting component includes a current-limiting circuit that in response to the current in the respective down-hole harness disconnects the down-hole harness from the detonator bus if the current exceeds a predetermined level.

8. A blasting system according to claim 7 wherein the current-limiting circuit is non-latching so that, when the current is reduced to an acceptable level, the connection to the down-hole harness is restored.

9. A blasting system according to claim 7 wherein the current-limiting circuit latches so that the down-hole harness remains disconnected from the detonator bus until power is removed for a reasonable period.

10. A blasting system which includes a blasting control machine, a detonator bus connected to the blasting control machine, a plurality of electronic detonators, a plurality of down-hole harnesses, each detonator of the plurality of detonators being connected to a respective down-hole harness of the plurality of down-hole harnesses, a plurality of connectors, each connector connecting the respective down-hole harness to the bus whereby the plurality of detonators are connected in parallel to the bus, wherein at least one current-limiting component is connected in series with the respective down-hole harness and said detonator; and wherein said current-limiting component limits current in the down-hole harness to a current level that can be accommodated by the blasting control machine in the presence of at least one fault that is present either in the down-hole harness or internally in the detonator, the at least one fault causing current leakage, wherein all of the plurality of detonators are connected in parallel to the bus.

11. A blasting system according to claim 10 wherein the at least one currently limiting component is a resistor.

12. A blasting system according to claim 10 wherein said current level is the level of the current which would flow if the current-limiting component were absent.

13. A blasting system according to claim 10 wherein said fault is a short circuit.

14. A blasting system according to claim 10 wherein the current-limiting component is located within a housing of the respective connector or in an in-line module which is connected to the down-hole harness.

15. A blasting system according to claim 10 wherein, in use, the current-limiting component is located outside a blast hole in which the respective detonator is positioned.

16. A blasting system according to claim 10 wherein the at least one current-limiting component is connected in series in a wire of the down-hole harness.

17. A blasting system according to claim 10 wherein the current-limiting component is selected from a resistor, a current-limiting diode and an FET latch circuit.

18. A blasting system according to claim 10 wherein the current-limiting component includes a current-limiting circuit that in response to the current in the respective downhole harness disconnects the down-hole harness from the detonator bus if the current exceeds a predetermined level.

19. A blasting system according to claim 18 wherein the current-limiting circuit is non-latching so that, when the current is reduced to an acceptable level, the connection to the down-hole harness is restored.

20. A blasting system according to claim 18 wherein the current-limiting circuit latches so that the down-hole harness remains disconnected from the detonator bus until power is removed for a reasonable period.

\* \* \* \* \*